United States Patent [19]

Talieh et al.

[11] Patent Number: 5,202,008
[45] Date of Patent: Apr. 13, 1993

[54] METHOD FOR PREPARING A SHIELD TO REDUCE PARTICLES IN A PHYSICAL VAPOR DEPOSITION CHAMBER

[75] Inventors: Humoyoun Talieh, Santa Clara; Haim Gilboa, Palo Alto; Donald M. Mintz, Sunnyvale, all of Calif.

[73] Assignee: Applied Materials, Inc., Santa Clara, Calif.

[21] Appl. No.: 895,209

[22] Filed: Jun. 8, 1992

Related U.S. Application Data

[63] Continuation of Ser. No. 715,883, Jun. 17, 1991, abandoned, which is a continuation of Ser. No. 487,567, Mar. 2, 1990, abandoned.

[51] Int. Cl.[5] .................... C23C 14/34; B44C 1/22; B24B 1/00
[52] U.S. Cl. .................... 204/192.32; 51/319; 51/320; 156/643; 204/192.35; 204/298.11
[58] Field of Search ............ 204/192.32, 192.33, 204/192.34, 192.35, 298.06, 298.11, 298.31, 298.34, 298.37; 156/345, 643, 646; 51/319, 320

[56] References Cited

U.S. PATENT DOCUMENTS

| 3,649,502 | 3/1972 | Herte et al. | 204/298.06 X |
|---|---|---|---|
| 3,699,034 | 10/1972 | Lins et al. | 204/298.06 X |
| 3,773,639 | 11/1973 | Masotti | 204/192 |
| 3,864,239 | 2/1975 | Fletcher et al. | 204/298.06 X |
| 4,368,092 | 1/1983 | Steinberg et al. | 204/298.34 X |
| 4,392,932 | 7/1983 | Harra | 204/298.34 X |
| 4,699,689 | 10/1987 | Bersin | 204/192.32 X |

FOREIGN PATENT DOCUMENTS

| 2088659 | 1/1972 | France . |
| 2147265 | 3/1973 | France . |
| 60-248876 | 5/1986 | Japan . |
| 63-162861 | 7/1988 | Japan . |
| 0307271 | 12/1988 | Japan | 204/298.06 |

OTHER PUBLICATIONS

Vossen et al., "Thin Film Processes", Academic Press, 1978, pp. 41–45 and 253–255.
EP Search Report for 91102324.0 dated Jul. 17, 1991.

*Primary Examiner*—Nam X. Nguyen
*Attorney, Agent, or Firm*—Birgit E. Morris

[57] ABSTRACT

In a method for preparing a shield for use in a physical vapor deposition process, the shield is sputter-etch cleaned to increase adhesion of deposits in the physical vapor deposition process. The sputter-etch cleaning serves to loosen contamination which may for a diffusion barrier and prevent the deposits from bonding to the shield. Also, the sputter-etch cleaning creates a high degree of micro-roughness. The roughness allows for an increase in nucleation sites which minimize the formation of interface voids. In addition to sputter-etch cleaning the shield may be bead blasted. The bead blasting makes the surface of the shield irregular. This enhances interface cracking of deposited material on a microscopic scale, resulting in less flaking.

25 Claims, 7 Drawing Sheets

METHOD FOR PREPARING A SHIELD TO REDUCE PARTICLES IN A PHYSICAL VAPOR DEPOSITION CHAMBER

This is a continuation of U.S. application Ser. No. 07/715,883 filed Jun. 17, 1991 which is a continuation of U.S. application Ser. No. 07/487,567 filed Mar. 2, 1990, now both abandoned.

BACKGROUND

The present invention concerns the preparation of shields in a physical vapor deposition chamber in order to increase shield adhesion and thereby achieve particle reduction.

In physical vapor deposition (PVD) processes a target material, for example titanium Tungsten, is bombarded by gaseous ions, for example Argon ions. Material from the target is dislodged and sputters onto a work piece. The work piece is generally a semiconductor wafer, but may be, for example, a magnetic disk or a flat panel display.

A PVD chamber generally includes shields in the area immediately around a wafer. The shields prevent excess material sputting from the target from contaminating the remainder of the PVD chamber.

For many types of sputtered materials, the build-up of excess material on the shields eventually results in flaking. At this point it is usually necessary to service the PVD chamber by replacing the shield. If shield replacement needs to be done at approximately the same time as target replacement, the service to shield may be performed without loss of operation time. However, if the shield needs to be replaced much more often than the target this can result in extra down-time of a system which can seriously impair production throughput. It is desirable, therefore, to seek ways to reduce flaking and thereby lengthen the time between shield replacement.

SUMMARY OF THE INVENTION

In accordance with the preferred embodiment of the present invention, a method is presented for preparing a shield for use in a physical vapor deposition process. The shield is sputter-etch cleaned to increase adhesion of deposits in the physical vapor deposition process. The sputter-etch cleaning serves to loosen contamination, such as oxides of the shield material, which may form a diffusion barrier and prevent the deposits from bonding to the shield. Also, the sputter-etch cleaning creates a high degree of surface roughness. This roughness allows for an increase in the ability of a sputtered film to mechanically adhere to the shield.

In addition to sputter-etch cleaning the shield may first be bead blasted. The bead blasting makes the surface of the shield irregular. This enhances interface crack propagation of deposited material on a submicroscopic scale and hinders the flaking of deposited material. This is because the surface irregularities force a fracture propagating along a plane of weakness to often change direction or pass through a strong region.

DESCRIPTION OF THE PREFERRED EMBODIMENT

Figure 1:
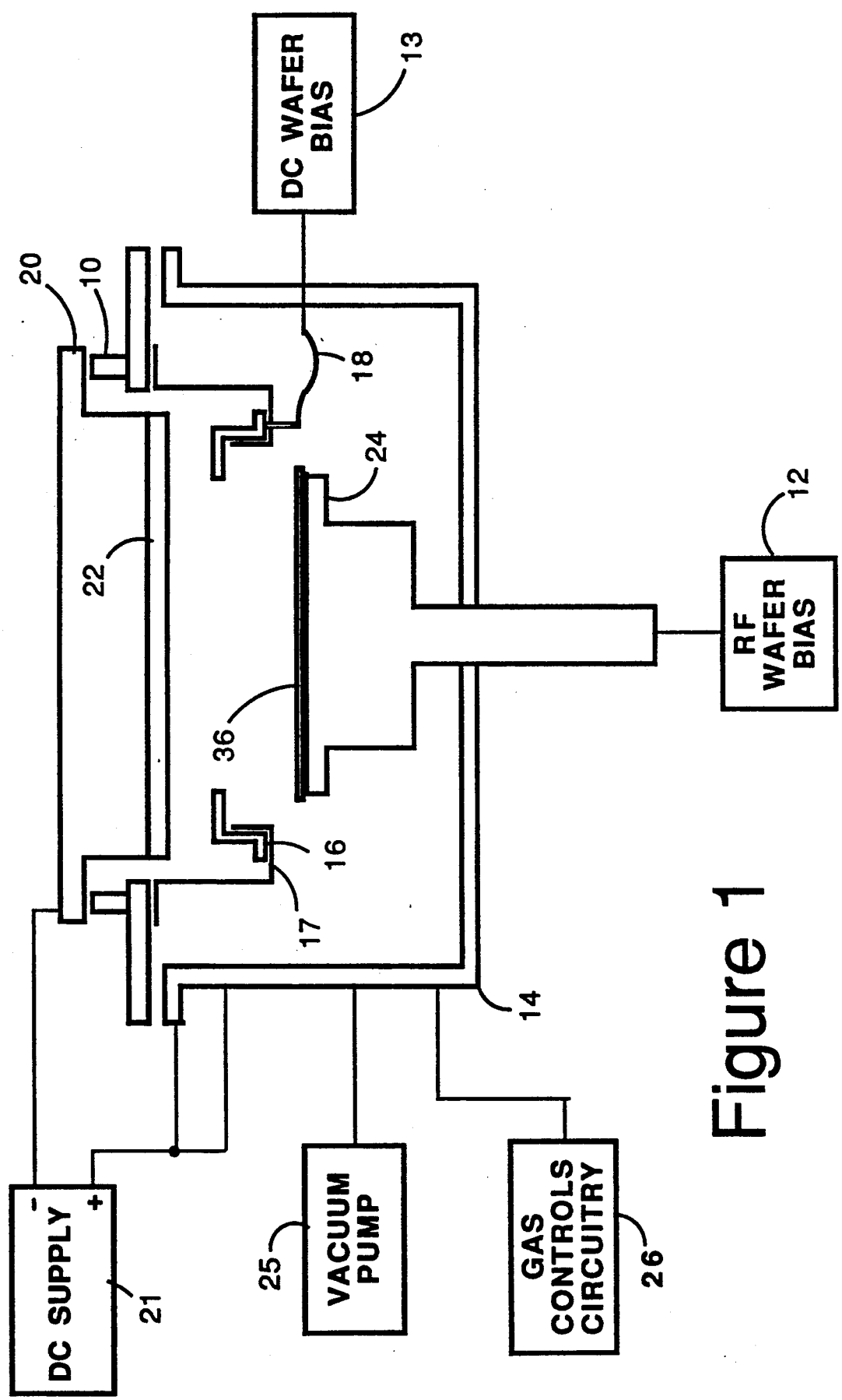
FIG. 1 is a simplified block diagram showing a physical vapor deposition chamber used for a sputter deposition process.

In FIG. 1, a physical vapor deposition (PVD) chamber 14 includes a movable wafer table 24. During the course of processing a specimen, i.e., a wafer 36, is placed on wafer table 24. Wafer table 24 is raised through a clamping ring 16 and a shield 17 to a processing location. An RF water bias circuit 12 provide an RF bias voltage to the wafer. A DC wafer bias circuit 13 provides a DC bias to the wafer through a line 18.

Gas control circuitry 26 controls gas flow in and out of chamber 14. A vacuum pump 25 is used to create a vacuum in PVD chamber 14 during processing of wafers.

A source 20 has a sputter target 22 composed of, for example, Titanium-Tungsten alloy. Source 20 is electrically isolated from shield 17 and the rest of PVD chamber 14 by an insulator ring 10. A DC power supply 21 establishes a voltage potential between shield 17 and source 20. When wafers are being processed, the negative terminal of DC power supply 21 is connected to target 22. The positive terminal is grounded to PVD chamber 14. This operating mode is used because gaseous ions from plasma will be accelerated toward whatever surface is connected to the negative terminal of power supply 21. Thus ions in deposition plasma strike target 22 and cause sputtering of Titanium-Tungsten alloy onto wafer 36 on wafer table 24.

Figure 2:
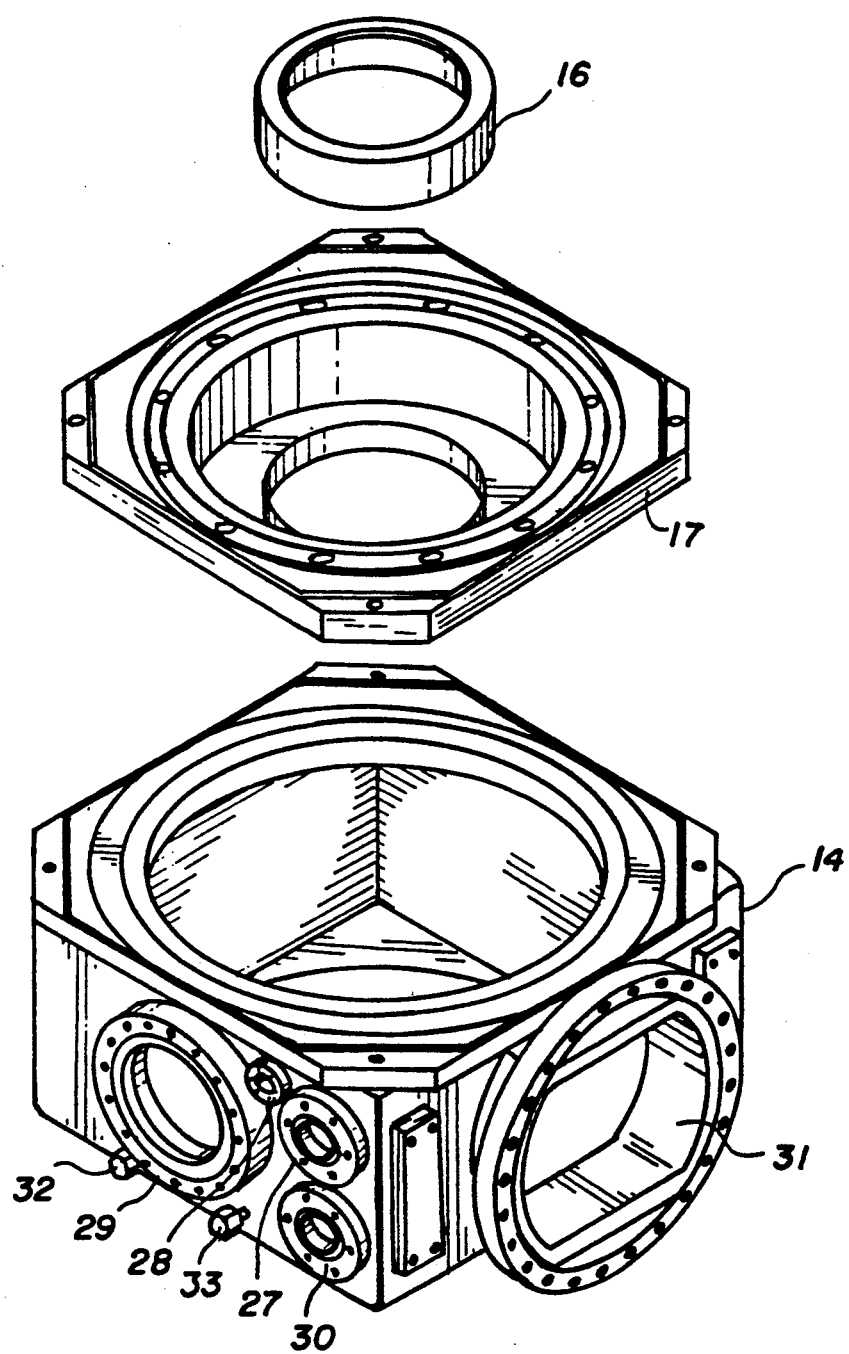
FIG. 2 shows a perspective view of a disassembled physical vapor deposition chamber in accordance with the preferred embodiment of the present invention.

FIG. 2 shows PVD chamber 14 shield 17 and clamping ring 16. Chamber 14 is shown to include ports 27, 28, 29, 30, 31, 32 and 33. Port 30 may be used, for example, by vacuum pump 25 or by a roughing pump for initial pumping to create a vacuum. Port 27 may be, for example, used by a residual gas analyzer. Port 28 may be, for example, used to allow a power line into PVD chamber 14, for example, to power a lamp used in PVD. Port 33 may be, for example, used for venting. Port 29 may be, for example, used as a window. Port 32 may be, for example, used for supplying Argon gas and reactive gas into chamber 14. Wafers are placed in PVD chamber 27 through an opening 31 by automated machinery (not shown).

During sputter deposition onto a wafer, excess Titanium Tungsten (TiW) material is deposited on shield 17 and clamping ring 16. This material builds up and eventually begins to flake. The flaking results in unwanted particles contaminating PVD chamber 14. The present invention pertains to preparing the surface of shield 17 to increase adhesion of excess material to the shield.

The adhesion strength of TiW depends on both the bonding strength between the TiW and the material of which shield 17 is made, and it depends on the microstructure of the interface region between the TiW and shield 17.

To increase bonding strength, shield 17 may be sputter-etch cleaned before usage. The sputter-etch cleaning serves to loosen contamination which may form a diffusion barrier and prevent the TiW from bonding to shield 17. Also, the sputter-etch cleaning creates a high density of micro surface roughness. These defects allow for an increase in nucleation sites which minimize the formation of interface voids.

Figure 3:
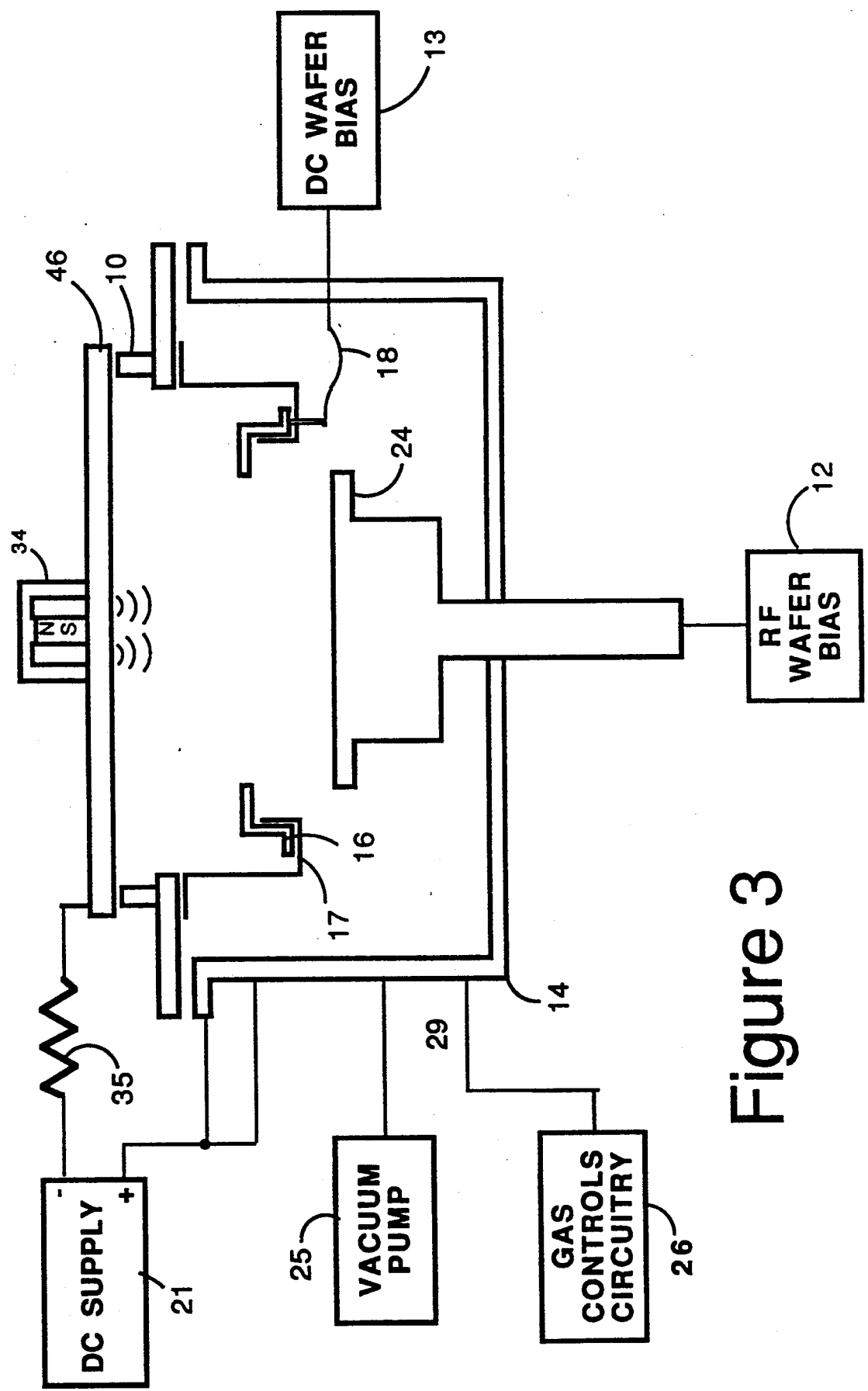
FIG. 3 shows a physical deposition chamber arranged to sputter-etch clean a shield in accordance with a preferred embodiment of the present invention.

In the preferred embodiment of the present invention, sputter-etch cleaning of the shields is done in a chamber from which source 20 is removed. As seen in FIG. 3, source 20 is replaced with a flat cover plate 46 fabricated of aluminum alloy, stainless steel, or some other vacuum compatible metallic material. In the center of cover plate 46 is mounted an arrangement of permanent magnets 34 which does not exceed half of the chamber lid size in diameter. During the etch process, cover plate 46 is biased positive to a value between +300 volts and +1000 volts. Cover plate 46 thus becomes the anode of a glow discharge in the vacuum chamber. Power in the range of 50 Watts to 500 Watts is applied to cover plate 46. The negative terminal of power supply 21 is grounded to PVD chamber 14, shield 17 and clamping ring 16. The preferred operating ambient is three to twelve Millitorr (0.5-2 Pa) of Argon.

Magnet assembly 34 is used to maintain plasma operation at the low operating pressures where the process is most efficient at etching the grounded shield 17 and clamping ring 16. Alternate means of striking the shield etch plasma include momentary application of high pressure in range of 50 Millitorr to 500 Millitorr range (7-70 Pa) and include the momentary application of a high voltage AC or DC. Two types of power supplies may be used to maintain the plasma. The first is a constant-power power supply with a rating of 1000 Volts and 1 kilowatt. The second is a 1000 Volt constant-voltage power supply used in conjunction with a high power ballast resistor 35.

At discharge powers of 250 Watts, shield 17 may typically be cleaned to a satisfactory degree after several minutes of the etch process.

For increased adhesion, before the sputter-etch cleaning of shield 17, shield 17 may be bead blasted. The bead blasting is done by bombarding shield 17 and clamping ring 16 with aluminum oxide abrasive powder. The bead blasting may be done in a commercially available sand blasting chamber.

The bead blasting makes the surface of shield 17 irregular. The irregular surface, on a microscopic scale, will enhance interface crack propagation of TiW material which is latter deposited on shield 17. Thus, the surface irregularities will result in the breaking up of the deposited films into sections are small with respect to flake sizes. This significantly hinders flaking.

Making the surface of shield 17 rough, both through etching and bead blasting, increases adhesion due to purely mechanical effects. The rough surface provides a greater surface area. In addition, the rough surface distributes stress, that is, when one side of a ridge is in tensile stress, the other side of the ridge is in compression stress.

Selection of material for shield 17 and clamping ring 16 also is important to maximize adhesion. Shields made of Titanium, stainless steel covered with a film of Aluminum, Aluminum or Molybdenum have proved to provide satisfactory adhesion.

Further, designing of shield 17 and clamping ring 16 to maximize the surface on which excess TiW material is deposited reduces the thickness of the deposits.

Although the discussion of the preferred embodiment has focussed on increasing adhesion of TiW material to shield 17, the invention is applicable to increasing adhesion of other materials used in physical vapor deposition chamber. For instance, the invention may be used to increase adhesion from excess material from depositions of pure Tungsten or a reactive deposition of titanium nitride.

Figure 4:
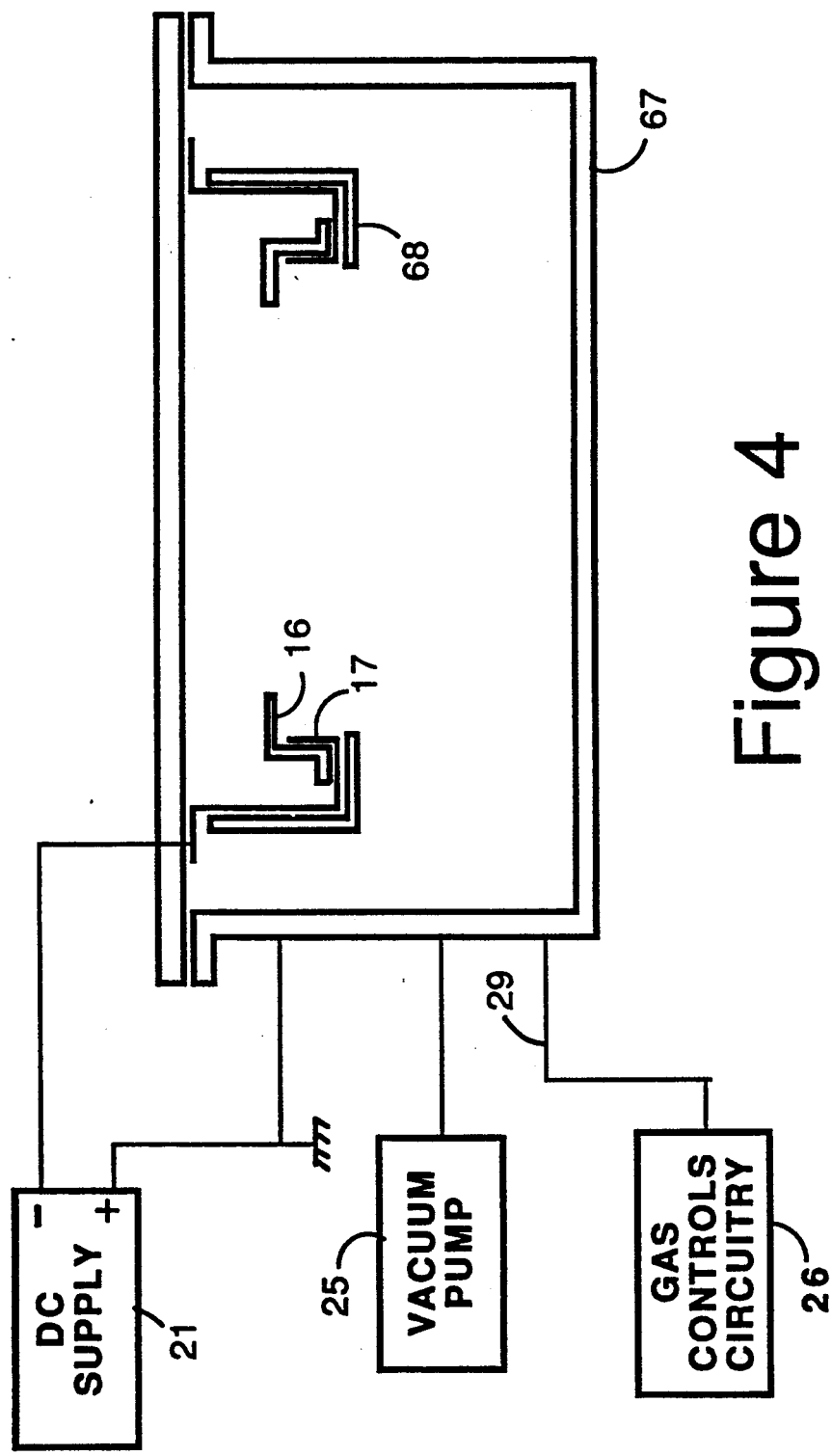
FIG. 4 is a block diagram of a system which uses a DC power supply to off-line etch a shield in preparation for use of the shield in a physical deposition chamber in accordance with an alternate embodiment of the present invention.

Alternately to in situ sputter etch cleaning in Argon, as described above, shield 17 may be prepared outside PVD chamber 14 in a stand-alone chamber 67. This is illustrated by FIG. 4 where shield 17 and clamping ring 16 are shown resting on an insulating fixture 68 in stand-alone chamber 67. In the sputter cleaning process, shield 17 and clamping ring 16 are made the cathode of a sputter etch plasma. This is done, for example, by connecting the negative terminal of power supply 21 to shield 17 and clamping ring 16, and grounding the positive terminal of power supply 21 to stand-alone chamber 67. Power applied may be, for example, in the range of 50 to 500 Watts. Operating pressure may be for example, in the range of two to eight Millitorrs. In order to etch only the side of shield 17 and clamping ring 16 that receive sputter deposits during processing in PVD chamber 14, portions of shield 17 and clamping ring 16 which will not receive sputter deposits are held against insulating fixture 68.

Figure 5:
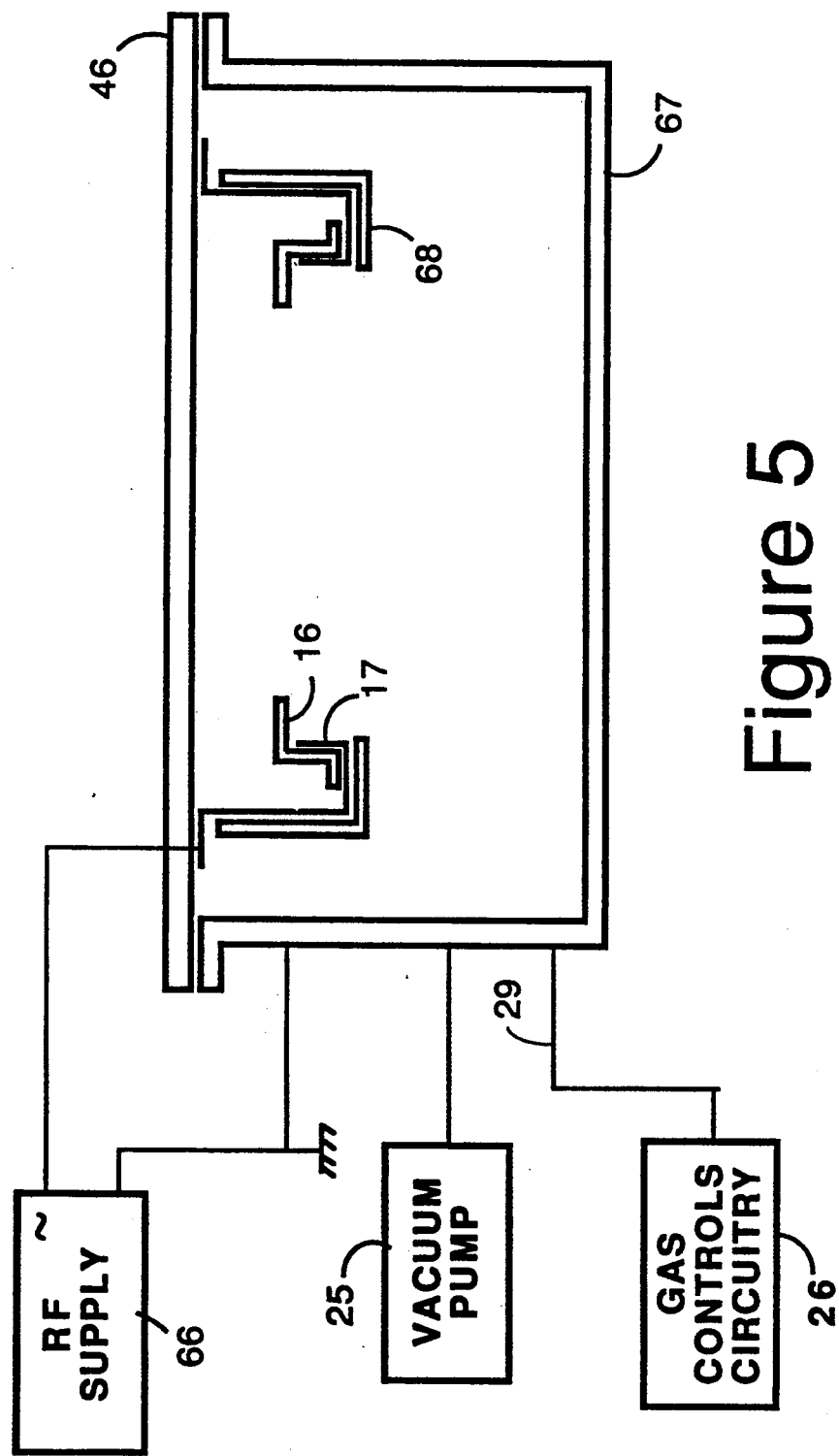
FIG. 5 is a block diagram of a system which uses a RF power supply to off-line etch a shield in preparation for use of the shield in a physical deposition chamber in accordance with an alternate embodiment of the present invention.

FIG. 5 shows the system of FIG. 4 modified so that an RF power signal is applied to shield 17 and clamping ring 16 by a power supply 66. The frequency of the RF signal may be, for example, 13.56 Megahertz or some other industrial, scientific or medical (ISM) frequency, for example 27.12 Magahertz or 40.68 Megahertz. When the operating pressure is in the range of two to eight Millitorr and the operating power is in the range of 50 to 500 Watts, adequate etching can be achieved in a few minutes.

Alternately to sputter etch cleaning, shield 17 and clamping ring 16 may be cleaned by gentle bombardment of a plasma (i.e., plasma leaning) below the threshold and under process conditions where no shield etch material is physically removed. For example, the surface of shield 17 and clamping ring 16 may be reacted in an oxygen plasma to intentionally produce an oxide scale to which certain sputtered materials might readily adhere. Alternately, oxide scale on shield 17 and clamping ring 16 could be removed without the evolution of sputtered metal atoms through the action of a hydrogen plasma. Such reactive processes could be performed in situ in PVD chamber 14, or alternately, could be performed off line in stand-alone chamber 67.

Figure 6:
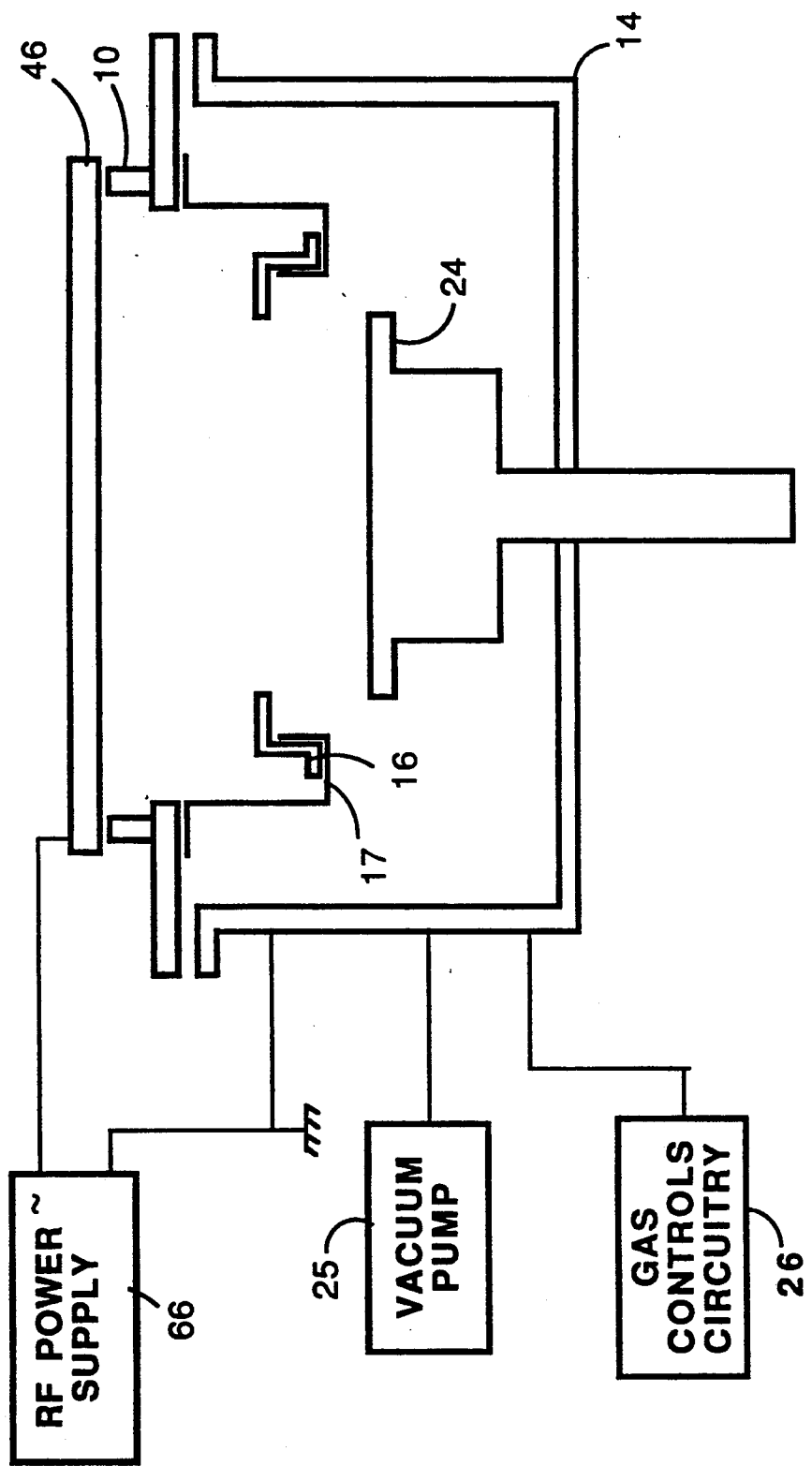
FIG. 6 shows a physical deposition chamber in which an RF power signal is placed on a lid for in situ reactive or non-reactive plasma treatment of a shield and a clamping ring in accordance with an alternate embodiment of the present invention.

In FIG. 6, PVD chamber 14 is shown modified to facilitate plasma cleaning. An RF power signal at an ISM frequency (e.g., 13.56 Megahertz) is applied to cover plate 46 of PVD chamber 14 by RF power supply 66. Typically for plasma cleaning, pressure inside PVD chamber 14 is 20 Millitorr to 2 Torr, and the RF power signal generates power of 50 to 200 Watts. At such an elevated pressure, collisions would retard sputter evolution of metal from shield 17 and clamping ring 16.

When plasma cleaning is done in stand-alone chamber 67 as shown in FIG. 5, for example, pressure inside stand-alone chamber 67 could be 20 Millitorr to 2 Torr, and an RF power signal could generate power of 50 to 200 Watts.

Alternately to sputtering and to plasma cleaning, shield 17 and clamping ring 16 may be cleaned using a non-reactive desorption cleaning process. For example, shield 17 and clamping ring 16 may be bombarded with Argon at energies below the energy threshold at which sputtering will take place. Such a non-reactive desorption cleaning is useful to dislodge from shield 17 and clamping ring 16 adsorbed water and residual liquid or solid contamination which might remain after wet cleaning shield 17 and clamping ring 16.

Non-reactive desorption cleaning may, for example, be performed in situ in PVD chamber 14, when PVD chamber is arranged as shown in FIG. 6. An RF power signal at an ISM frequency (e.g., 13.56 Megahertz) is applied to cover plate 46 of PVD chamber 14 by RF power supply 66. Inside PVD chamber 14 is an inert gas ambient such as Argon. Alternately Helium, Neon, or Krypton could be used instead of Argon. When pressure inside PVD chamber 14 is 20 Millitorr to 2 Torr, and the RF power signal generates power of 50 to 500 Watts, sufficient collisions would slow down plasma ions such that a high density could be built up with less than 10 electron-Volts of energy. The impact of the plasma ions on shield 17 and clamping ring 16 would desorb physisorbed species.

Alternately, non-reactive desorption cleaning may, for example, be performed off line in stand-along chamber 67. An RF power signal at an ISM frequency (e.g., 13.56 Megahertz) is applied to shield 17 and clamping ring 16 by RF power supply 66. Inside stand-along chamber 67 is an inert gas ambient such as Argon. Alternately Helium, Neon, or Krypton could be used instead of Argon. When pressure inside stand-alone chamber 67 is 20 Millitorr to 2 Torr, and the RF power signal generates power of 50 to 500 Watts, sufficient collisions would slow down plasma ions such that a high density could be built up with less than 10 electron-Volts of energy. The impact of the plasma ions on shield 17 and clamping ring 16 would desorb physisorbed species. The use of insulating fixture 68 is optional as no metal is sputtered from shield 17 or clamping ring 16.

Plasma used in a reactive plasma process may come from generating reactive species in a separate upstream plasma preparation chamber. One advantage of such a method is that an upstream plasma preparation chamber may be considerably smaller than the parts that are processed. Upstream activation of reactive plasma may be done whether plasma etching is done in situ in a PVD chamber, or in a stand-alone chamber.

Figure 7:
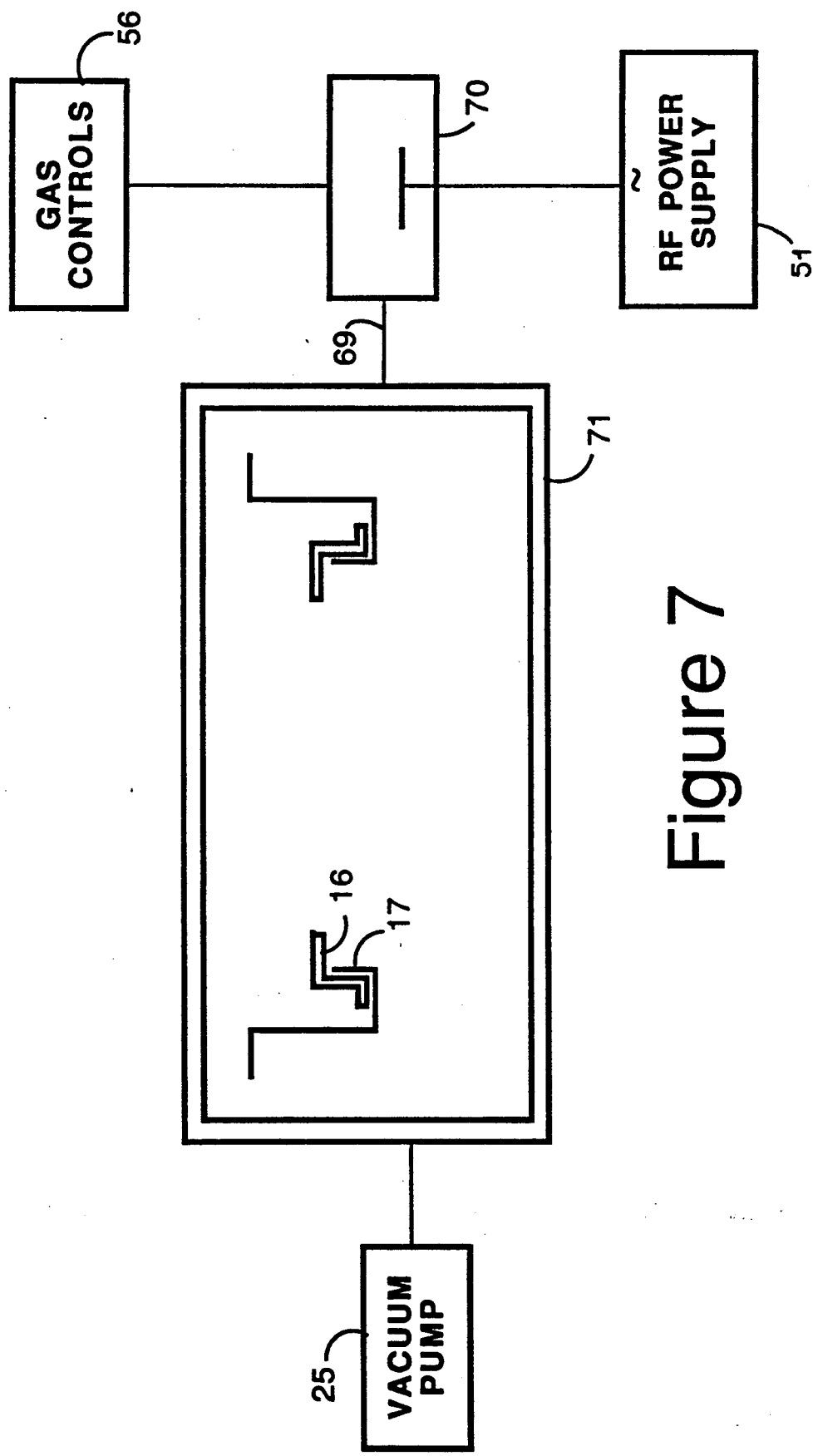
FIG. 7 is a block diagram of a system in which is performed off-line or in situ plasma treatment of a shield in preparation for use of the shield in a physical deposition chamber where the plasma is generated in a special upstream chamber in accordance with an alternate embodiment of the present invention.

For example, FIG. 7 shows shield 17 and clamping ring 16 placed in a chamber 71. Plasma is activated in an upstream plasma preparation chamber 70 before being pumped through a port 69 to chamber 71. A power supply 51 supplies either a DC power signal or a RF power signal to upstream plasma preparation chamber 70. Effluent, for example atomic hydrogen ($H_2$), atomic oxygen ($O_2$), or atomic fluorine ($NF_3$), passes to shield 17 and clamping ring 16 in chamber 71 through a connection 69. When the pressure within upstream plasma preparation chamber 70 is in the range of 10 Millitorr to one Torr, and power supply 51 supplies power in the range of 50 to 500 Watts, upstream plasma preparation chamber 70 is generally able to produce copoius amounts of reactive atomic species.

We claim:

1. A method for increasing the lifetime of a shield for use in a physical vapor deposition process, the method comprising the steps of:
   (a) bead blasting the shield, and
   (b) sputter-etch cleaning the shield, thereby roughening the surface of the shield and increasing its surface area, prior to using the shield in a physical vapor deposition process.

2. A method as in claim 1 wherein the bead blasting is done with an aluminum oxide abrasive powder.

3. A method as in claim 1 wherein the shield comprises Titanium.

4. A method as in claim 1 wherein the shield comprises Aluminum.

5. A method as in claim 1 wherein the shield comprises Molybdenum.

6. A method as in claim 1 wherein the shield comprises stainless steel covered with a film of aluminum.

7. A method as in claim 1 wherein the sputter-etch cleaning is done in a chamber in which power, within the range of 50 Watts to 500 Watts, is applied to an anode plate mounted in the chamber in place of a sputter source.

8. A method as in claim 7 the power applied to anode plate mounted in the chamber in place of a sputter source is an DC power signal.

9. A method as in claim 7 the power applied to anode plate mounted in the chamber in place of a sputter source is an RF power signal.

10. A method as in claim 1 wherein the sputter-etch cleaning of the shield is done in situ in a physical vapor deposition chamber used in the physical vapor deposition process.

11. A method as in claim 1 wherein the sputter-etch cleaning of the shield is done off line in a stand-alone chamber not used in the physical vapor deposition process.

12. A method for increasing the lifetime of a shield for use in a physical vapor deposition process, the method comprising the steps of:
    (a) bead blasting the shield, and
    (b) reactive plasma cleaning the shield, thereby roughening the surface of the shield and increasing its surface area, prior to using the shield in a physical vapor deposition process.

13. A method as in claim 12 wherein the bead blasting is done with an aluminum oxide abrasive powder.

14. A method as in claim 12 wherein plasma is activated in an upstream activation chamber.

15. A method as in claim 12 wherein plasma is activated in a chamber in which the shield is reactive plasma cleaned.

16. A method as in claim 12 wherein the plasma comprises $O_2$.

17. As method a in claim 12 wherein the plasma comprises $H_2$.

18. A method as in claim 12 wherein the shield comprises Titanium.

19. A method as in claim 12 wherein the shield comprises Aluminum.

20. A method as in claim 12 wherein the shield comprises Molybdenum.

21. A method as in claim 12 wherein the shield comprises stainless steel covered with a film of aluminum.

22. A method for increasing the lifetime of a shield for use in a physical vapor deposition process, the method comprising the steps of:
  (a) bead blasting the shield, and
  (b) cleaning the shield using non-reactive plasma, thereby roughening the surface of the shield and increasing its surface area, prior to using the shield in a physical vapor deposition process.

23. A method as in claim 22 wherein the bead blasting is done with an aluminum oxide abrasive powder.

24. A method as in claim 22 wherein the plasma comprises an inert gas ambient.

25. A method as in claim 24 wherein the inert gas ambient is Argon.

* * * * *